US011131709B2

(12) United States Patent
Frankel et al.

(10) Patent No.: US 11,131,709 B2
(45) Date of Patent: Sep. 28, 2021

(54) PROBE SYSTEMS FOR OPTICALLY PROBING A DEVICE UNDER TEST AND METHODS OF OPERATING THE PROBE SYSTEMS

(71) Applicant: FormFactor, Inc., Livermore, CA (US)

(72) Inventors: Joseph George Frankel, Beaverton, OR (US); Kazuki Negishi, Hillsboro, OR (US); Michael E. Simmons, Colton, OR (US); Eric Robert Christenson, Tualatin, OR (US); Daniel Rishavy, Austin, TX (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 17/021,288

(22) Filed: Sep. 15, 2020

(65) Prior Publication Data

US 2021/0096176 A1    Apr. 1, 2021

Related U.S. Application Data

(60) Provisional application No. 62/908,440, filed on Sep. 30, 2019, provisional application No. 62/908,423, filed on Sep. 30, 2019, provisional application No. 62/908,403, filed on Sep. 30, 2019, provisional application No. 62/939,399, filed on Nov. 22, 2019.

(51) Int. Cl.
*G01R 31/28* (2006.01)
*G01R 1/067* (2006.01)

(52) U.S. Cl.
CPC ..... *G01R 31/2889* (2013.01); *G01R 1/06794* (2013.01); *G01R 31/2891* (2013.01)

(58) Field of Classification Search
CPC .......... G01R 1/06794; G01R 31/2891
See application file for complete search history.

(56) References Cited

U.S. PATENT DOCUMENTS

| | | | |
|---|---|---|---|
| 2003/0025495 A1 | 2/2003 | Ilno et al. | |
| 2003/0182993 A1 | 10/2003 | Hantschel et al. | |
| 2004/0123651 A1 | 7/2004 | Hantschel et al. | |
| 2005/0083038 A1 | 4/2005 | Rothaug et al. | |
| 2007/0040549 A1 | 2/2007 | Komatsu | |
| 2012/0098559 A1* | 4/2012 | Bolt | G01J 1/0425 324/754.03 |

(Continued)

OTHER PUBLICATIONS

U.S. Appl. No. 16/914,913, filed Jun. 29, 2020, Frankel.
U.S. Appl. No. 16/884,921, filed May 27, 2020, Negishi, et al..

*Primary Examiner* — Paresh Patel
(74) *Attorney, Agent, or Firm* — Dascenzo Gates Inellectual Property Law, P.C.

(57) ABSTRACT

Probe systems for optically probing a device under test (DUT) and methods of operating the probe systems. The probe systems include a probing assembly that includes an optical probe that defines a probe tip and a distance sensor. The probe systems also include a support surface configured to support a substrate, which defines a substrate surface and includes an optical device positioned below the substrate surface. The probe systems further include a positioning assembly configured to selectively regulate a relative orientation between the probing assembly and the DUT. The probe systems also include a controller programmed to control the operation of the probe systems. The methods include methods of operating the probe systems.

20 Claims, 3 Drawing Sheets

(56) References Cited

U.S. PATENT DOCUMENTS

| | | | |
|---|---|---|---|
| 2017/0205443 A1* | 7/2017 | Bolt | G01R 31/2891 |
| 2019/0227102 A1 | 7/2019 | Frankel et al. | |
| 2020/0378888 A1* | 12/2020 | Negishi | G01N 21/274 |
| 2021/0096175 A1* | 4/2021 | Frankel | G01R 1/06794 |

* cited by examiner

PROBE SYSTEMS FOR OPTICALLY PROBING A DEVICE UNDER TEST AND METHODS OF OPERATING THE PROBE SYSTEMS

RELATED APPLICATIONS

This application claims priority to U.S. Provisional Patent Application Nos. 62/908,403, 62/908,423, and 62/908,440, which were filed on Sep. 30, 2019, and also claims priority to U.S. Provisional Patent Application No. 62/939,399, which was filed on Nov. 22, 2019, and the complete disclosures of which are hereby incorporated by reference.

FIELD OF THE DISCLOSURE

The present disclosure relates generally to probe systems for optically probing a device under test and/or to methods of operating the probe systems.

BACKGROUND OF THE DISCLOSURE

Probe systems may be utilized to probe and/or to test the operation of a device under test (DUT). In the electronics industry, probe systems historically have taken the form of electrical probe systems that provide a probe electric current to the DUT and/or that receive a corresponding resultant electric current from the DUT. More recently, optical probe systems have been developed to probe optical DUTs that include optical components. Conventionally, both electrical probe systems and optical probe systems have conveyed test signals to the DUT and/or received resultant signals from the DUT from, or from above, a substrate surface of a substrate that includes the DUT. However, in state-of-the art optical DUTs, optical devices may be defined within planes that may be parallel to a substrate surface of the substrate and/or may be configured to propagate optical signals within these planes. In such state-of-the-art optical DUTs, access to these optical devices may be provided via trenches that may be defined below the substrate surface. Conventional electrical probe systems and/or optical probe systems may be unable to reliably probe within such trenches. Thus, there exists a need for improved probe systems for optically probing a device under test and/or for methods of operating the probe systems.

SUMMARY OF THE DISCLOSURE

Probe systems for optically probing a device under test (DUT) and methods of operating the probe systems. The probe systems include a probing assembly that includes an optical probe that defines a probe tip. The probing assembly also includes a distance sensor that defines a sensor surface. The probe systems also include a support surface configured to support a substrate. The substrate defines a substrate surface and includes an optical device positioned below the substrate surface. The probe systems further include a positioning assembly configured to selectively regulate a relative orientation between the probing assembly and the DUT. The probe systems also include a controller programmed to control the operation of the probe systems. The controller is programmed to determine a sensed distance between the sensor surface and the substrate surface. The controller also is programmed to calculate at least one probe distance between the optical probe and the substrate. The probe distance is calculated based, at least in part, on the sensed distance. The controller further is programmed to adjust the relative orientation between the probing assembly and the DUT with the positioning assembly. The controller also is programmed to regulate adjustment of the relative orientation based, at least in part, on the at least one probe distance to maintain at least a threshold separation distance between the optical probe and the substrate.

The methods include methods of operating the probe systems.

DETAILED DESCRIPTION AND BEST MODE OF THE DISCLOSURE

Figure 1:
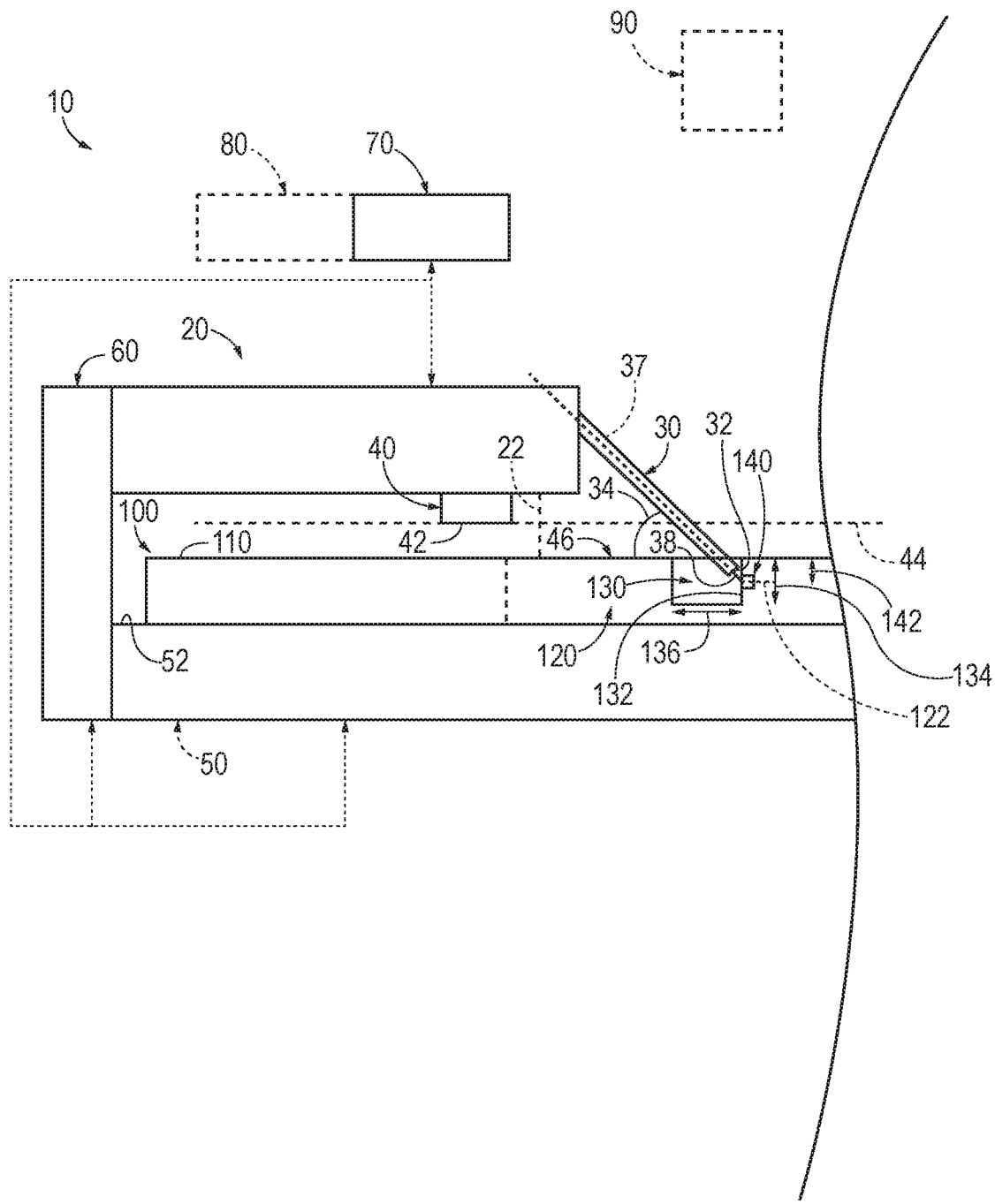
FIG. 1 is a schematic illustration of examples of probe systems that may perform methods, according to the present disclosure.
Figure 2:
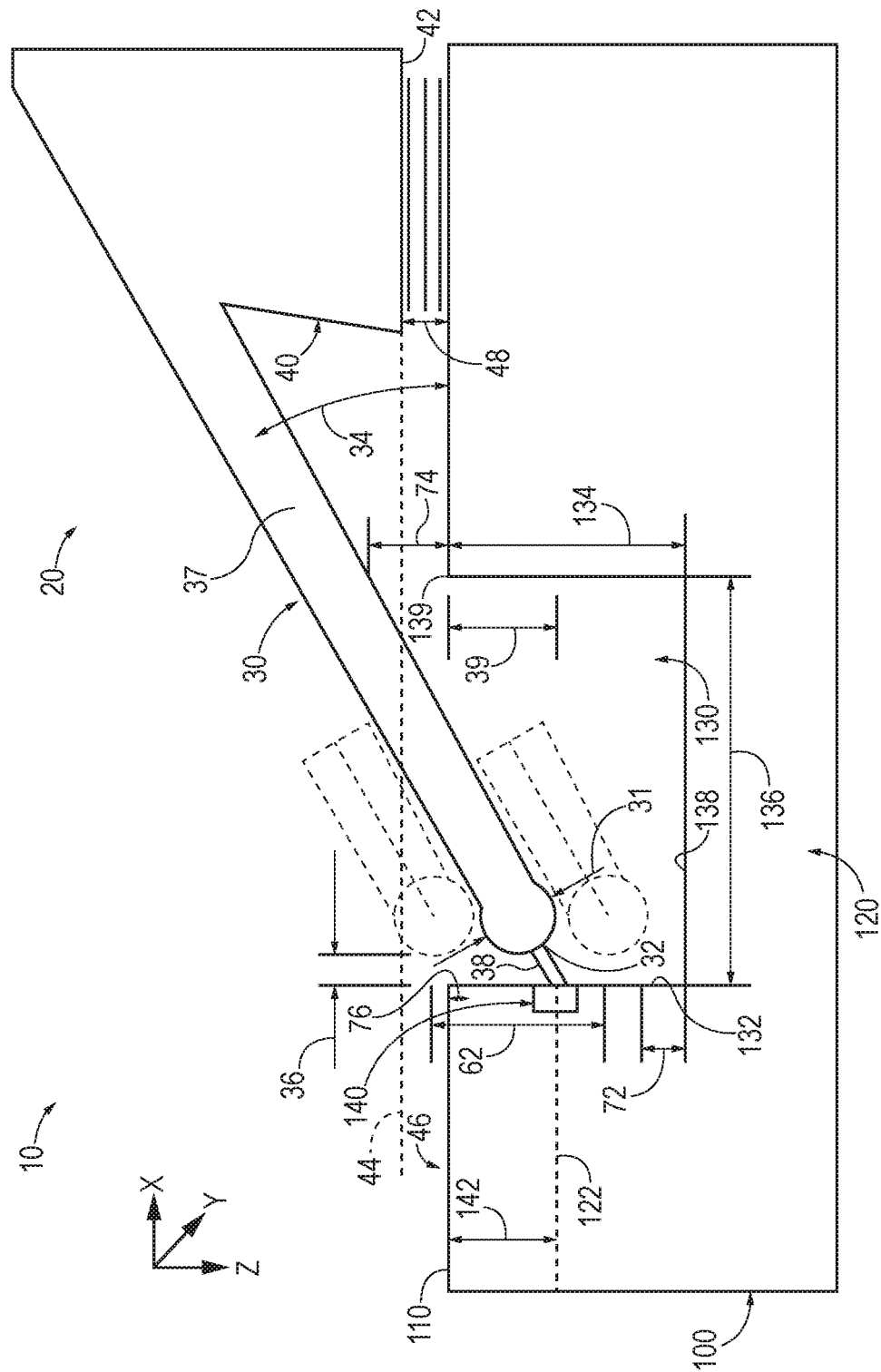
FIG. 2 is a more detailed view illustrating a region of the probe systems of FIG. 1.
Figure 3:
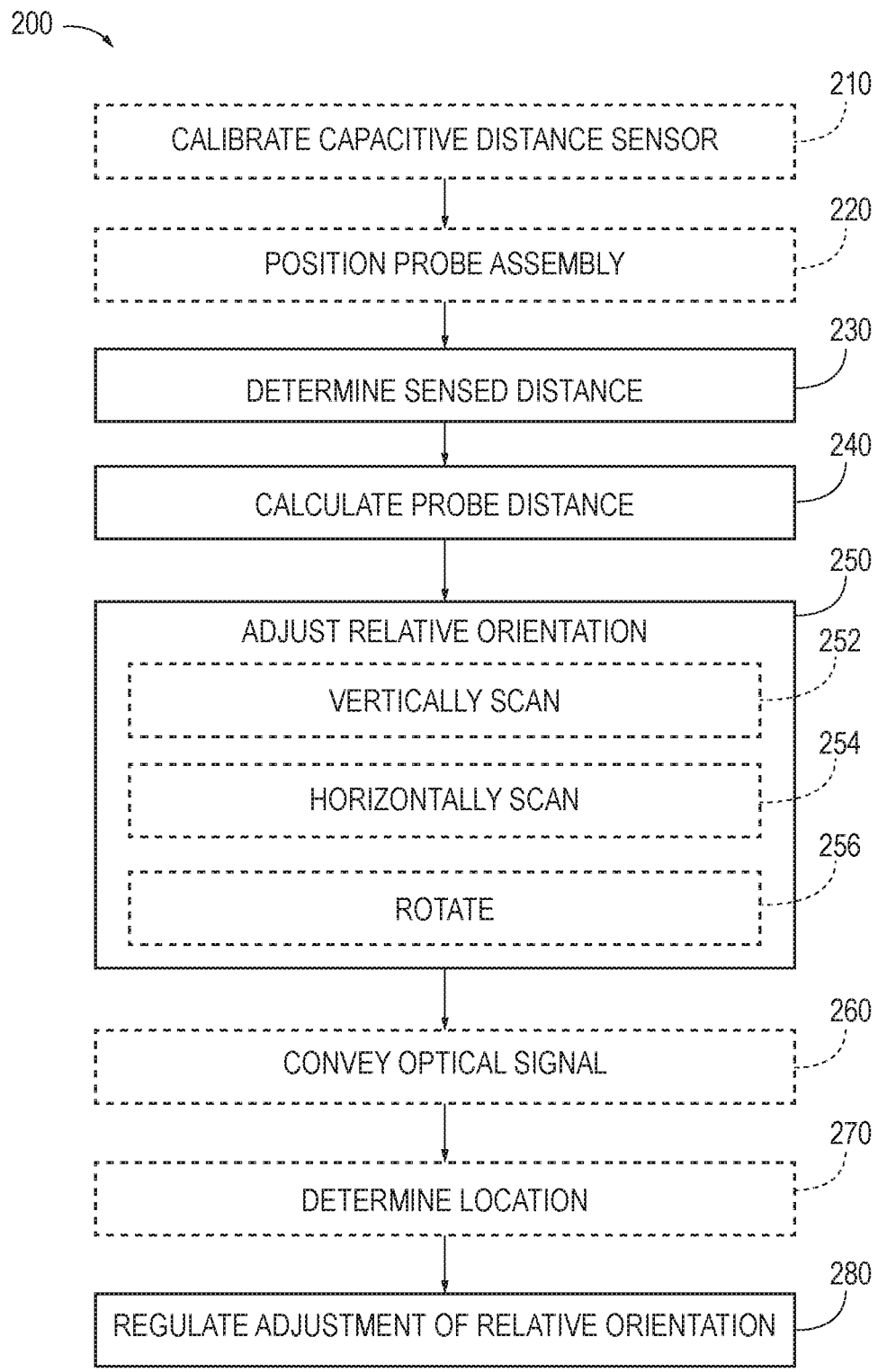
FIG. 3 is a flowchart depicting examples of methods of optically probing with probe systems, according to the present disclosure.

FIGS. 1-3 provide examples of probe systems 10 and/or of methods 200, according to the present disclosure. Elements that serve a similar, or at least substantially similar, purpose are labeled with like numbers in each of FIGS. 1-3, and these elements may not be discussed in detail herein with reference to each of FIGS. 1-3. Similarly, all elements may not be labeled in each of FIGS. 1-3, but reference numerals associated therewith may be utilized herein for consistency. Elements, components, and/or features that are discussed herein with reference to one or more of FIGS. 1-3 may be included in and/or utilized with any of FIGS. 1-3 without departing from the scope of the present disclosure. In general, elements that are likely to be included in a particular embodiment are illustrated in solid lines, while elements that are optional are illustrated in dashed lines. However, elements that are shown in solid lines may not be essential and, in some embodiments, may be omitted without departing from the scope of the present disclosure.

FIG. 1 is a schematic illustration of examples of probe systems 10 that may perform methods, such as methods 200 of FIG. 3, according to the present disclosure. FIG. 2 is a more detailed view illustrating a region of the probe systems of FIG. 1. As illustrated in FIGS. 1-2, probe systems 10 may be configured to optically probe a trench side-wall 132 of a trench 130 that may be defined within a device under test 120. The device under test may be positioned and/or defined on a substrate 100 that defines a substrate surface 110, and the trench side-wall may include an optical device 140 that may be positioned a device distance 142 below substrate surface 110. Device distance 142 also may be referred to herein as a distance below substrate surface 110 at which optical device 140 receives photons 38, is configured to receive photons 38, transmits photons 38, and/or is configured to transmit photons 38. Trench 130 may define a trench depth 134 and/or a trench width 136. Examples of substrate 100 include a wafer, a silicon wafer, semiconductor wafer, a Group-IV semiconductor wafer, and/or a silicon photonics substrate. Examples of optical device 140 include a silicon photonics device, an optical detector, an optical transmitter, a waveguide, and/or a solid-state optical device.

As also illustrated in FIGS. 1-2, probe systems 10 include a probing assembly 20. Probing assembly 20 includes an optical probe 30 that defines a probe tip 32. Optical probe 30 may extend at an angle, or at a skew angle, 34, relative to substrate surface 110. Angle 34 additionally or alternatively may be referred to herein as and/or may be an incident angle 34 between a photon propagation axis 122 within DUT 120 and a probe axis 37 at which photons 38 propagate within optical probe 30.

Probing assembly 20 also includes a distance sensor 40 that defines a sensor surface 42. Probe 30 may extend through a plane, or a surface plane, 44 that may extend within and/or from sensor surface 42, and probe tip 32 may be positioned on a sensor-opposed side 46 of the plane. Such a configuration may permit and/or facilitate extension of probe tip 32 within trench 130 prior to, or without, contact, or physical contact, between sensor surface 42 and substrate surface 110.

Turning to the more schematic illustrations of FIG. 1, probe systems 10 also include a support surface 52, a positioning assembly 60, and a controller 70. Support surface 52 may be configured to support substrate 100. Positioning assembly 60 may be configured to selectively regulate a relative orientation between probing assembly 20 and substrate 100 and/or DUT 120 thereof. Controller 70 may be adapted, configured, and/or programmed to control the operation of at least a portion of probe systems 10. This may include control of the probe systems according to any suitable step and/or steps of methods 200, which are discussed in more detail herein with reference to FIG. 3.

During operation of probe systems 10, and as discussed in more detail herein with reference to methods 200 of FIG. 3, probe tip 32 of optical probe 30 may be positioned within trench 130. This may include positioning of the probe tip such that a predetermined, predefined, desired, and/or specified gap 36 spatially separates the probe tip and trench side-wall 132. Subsequently, probe tip 32 may be scanned vertically (i.e., in the Z-direction of FIG. 2) and/or horizontally (i.e., in the Y-direction of FIG. 2) along trench side-wall 132 and/or may be rotated, such as about the X-, Y-, and/or Z-axes of FIG. 2. This scanning may be performed utilizing positioning assembly 60. During the scanning, photons 38 may be transferred between optical device 140 and probe tip 32 of optical probe 30. As an example, and as illustrated in FIG. 2, probe tip 32 may be scanned vertically a vertical distance 62. This process may be referred to herein as raster scanning and/or may be utilized to produce and/or generate a two-dimensional, or a multi-dimensional, representation of optical coupling between the probe tip and the optical device as a function of location on the trench side-wall and/or as a function of rotation of the probe tip relative to the trench side-wall.

While probe tip 32 is scanned along the trench side-wall, controller 70 may repeatedly and/or continuously measure a sensed distance 48 between distance sensor 40 and substrate surface 110 and may calculate a distance between at least one region and/or portion of optical probe 30 and substrate 100 based, at least in part, on the sensed distance. Controller 70 then may regulate and/or control the operation of positioning assembly 60 to maintain at least a threshold separation distance between the at least one region and/or portion of the optical probe and the substrate. Stated another way, controller 70 may be utilized to ensure that probing assembly 20 and/or optical probe 30 thereof does not contact, or crash into, substrate 100. Such contact, if it occurs, may be detrimental and/or damaging to the probing assembly and/or to the substrate. As an example, probe tip 32 may define a lens, which may be damaged by such contact and/or no longer may be able to propagate protons 38 in a desired manner and/or with desired properties subsequent to such contact. Examples of the threshold separation distance include separation distances that are greater than zero, such as separation distances of at least 1 micrometer, at least 2.5 micrometers, at least 5 micrometers, at least 10 micrometers, at least 25 micrometers, at least 50 micrometers, or at least 100 micrometers.

It is within the scope of the present disclosure that controller 70 may maintain any suitable threshold separation distance between any suitable region and/or portion of optical probe 30 and any corresponding region and/or portion of substrate 100. As an example, and as illustrated in FIG. 2, controller 70 may maintain a threshold tip-bottom separation distance 72 between probe tip 32 and a bottom surface 138 of trench 130. As another example, controller 70 may maintain a threshold probe-edge separation distance 74 between optical probe 30 and a trench edge 139 of trench 130. As yet another example, controller 70 may maintain a threshold tip-surface separation distance 76 of probe tip 32 below substrate surface 110.

Optical probe 30 may include and/or be any suitable structure that may be adapted, configured, designed, and/or constructed to form a portion of probing assembly 20, to define probe tip 32, to receive photons 38 from optical device 140, and/or to convey photons 38 to optical device 140. Examples of optical probe 30 include an optical fiber, a cleaved optical fiber, a lensed optical fiber, a 3-D printed fiber, and/or a faceted optical fiber.

Distance sensor 40 may include and/or be any suitable sensor that may be adapted, configured, designed, and/or constructed to sense, determine, and/or detect sensed distance 48. Examples of distance sensor 40 include a capacitive distance sensor, an optical distance sensor, and/or an interferometer. In general, distance sensor 40 may be configured to determine sensed distance 48 to within a threshold distance resolution. Examples of the threshold distance resolution include at most 100 nanometers, at most 50 nanometers, at most 40 nanometers, at most 30 nanometers, at most 20 nanometers, at most 10 nanometers, at most 5 nanometers, at most 4 nanometers, at most 3 nanometers, at most 2 nanometers, at most 1 nanometer, at least 0.1 nanometers, at least 0.5 nanometers, at least 1 nanometer, and/or at least 2 nanometers.

Support surface 52 may include and/or be any suitable surface that may support, or that may be configured to support, substrate 100. As an example, support surface 52 may include and/or be a surface and/or an upper surface of a chuck 50, as illustrated in FIG. 1. Examples of chuck 50 include a vacuum chuck, an electrostatic chuck, a temperature-controlled chuck, and/or a translation stage.

Positioning assembly 60 may include any suitable structure that may be adapted, configured, designed, and/or constructed to adjust, or to electrically adjust, the relative orientation between probing assembly 20 and DUT 120. This may include adjustment of the position, or of the absolute position, of the probing assembly, of the DUT, and/or of both the probing assembly and the DUT. Examples of positioning assembly 60 include a motorized positioning assembly, a piezoelectric positioning assembly, a rack-and-pinion assembly, a micrometer screw, a lead screw and nut assembly, and/or a ball screw assembly. As discussed, positioning assembly 60 may be configured to move probing assembly 20 and/or support surface 110 in one, two, or three dimensions, such as along the X, Y, and/or Z axes of FIG. 2 and/or to rotate the probing assembly and/or the DUT about one, two, and/or three axes, such as the X, Y, and/or Z-axes of FIG. 2. Additionally or alternatively, positioning assembly 60 may be configured to rotate probing assembly 20 and/or support surface 110 about one, two, and/or three axes, such as the X, Y, and Z axes.

Controller 70 may include and/or be any suitable structure, device, and/or devices that may be adapted, configured, designed, constructed, and/or programmed to perform one or more of the functions disclosed herein. This may include control of the operation of any suitable portion, region, and/or structure of probe systems 10, such as positioning assembly 60. As examples, controller 70 may include one or more of an electronic controller, a dedicated controller, a special-purpose controller, a personal computer, a special-purpose computer, a display device, a logic device, a memory device, and/or a memory device having computer-readable storage media.

The computer-readable storage media, when present, also may be referred to herein as non-transitory computer readable storage media. This non-transitory computer readable storage media may include, define, house, and/or store computer-executable instructions, programs, and/or code; and these computer-executable instructions may direct probe systems 10 and/or controller 70 thereof to perform any suitable portion, or subset, of methods 200. Examples of such non-transitory computer-readable storage media include CD-ROMs, disks, hard drives, flash memory, etc. As used herein, storage, or memory, devices and/or media having computer-executable instructions, as well as computer-implemented methods and other methods according to the present disclosure, are considered to be within the scope of subject matter deemed patentable in accordance with Section 101 of Title 35 of the United States Code.

As illustrated in dashed lines in FIG. 1, probe systems 10 may include a signal generation and analysis assembly 80. Signal generation and analysis assembly 80, when present, may be adapted, configured, designed, and/or constructed to generate an optical test signal, such as may be provided to optical device 140 by optical probe 30 in the form of photons 38 and/or to receive an optical resultant signal, such as may be received from optical device 140 by optical probe 30 in the form of photons 38. Signal generation and analysis assembly 80 additionally or alternatively may be configured to generate an electronic test signal, such as may be provided to DUT 120 by an electrical probe 22, which is illustrated in FIG. 1, and/or to receive an electronic resultant signal, such as may be received from DUT 120 by electrical probe 22. Signal generation and analysis assembly 80 additionally or alternatively may be adapted, configured, designed, and/or constructed to analyze the operation and/or performance of DUT 120, such as may be based upon the optical test signal, the optical resultant signal, the electronic test signal, and/or the electronic resultant signal. Examples of signal generation and analysis assembly 80 include an optical source, which may be configured to generate the optical test signal, an optical detector, which may be configured to detect the optical resultant signal, an electric source, which may be configured to generate the electronic test signal, and/or an electric detector, which may be configured to detect the electronic resultant signal.

As also illustrated in dashed lines in FIG. 1, probe systems 10 may include an optical assembly 90. Optical assembly 90, when present, may be configured to view and/or to generate an optical image of any suitable portion and/or region of probe systems 10, such as probing assembly 20, optical probe 30, probe tip 32, substrate 100, DUT 120, and/or trench 130. This may include any suitable top-down view, such as may be illustrated by the configuration of FIG. 1, and/or any suitable side view, such as may be illustrated in FIG. 2. Examples of optical assembly 90 include a microscope, an optical microscope, an electronic microscope, an optical imaging device, and/or a camera. Optical assembly 90 also may be referred to herein as and/or may be an imaging device 90.

FIG. 3 is a flowchart depicting examples of methods 200 of optically probing with probe systems, such as probe systems 10 of FIGS. 1-2, according to the present disclosure. As discussed herein with reference to FIGS. 1-2, methods 200 may be utilized to optically probe a trench side-wall of a trench defined within a device under test (DUT). The DUT may be defined on a substrate that defines a substrate surface. The trench side-wall may include an optical device positioned a device distance below the substrate surface. The probe systems may include a probing assembly that includes an optical probe and a distance sensor, or a capacitive distance sensor, that defines a sensor surface. The optical probe may extend through a plane that extends within the sensor surface, and a probe tip of the optical probe may be positioned on a sensor-opposed side of the plane. The probe systems also may include a positioning assembly configured to selectively regulate a relative orientation between the probing assembly and the DUT. Complementary methods for maintaining gap spacing between an optical probe of probe systems and an optical device are disclosed in U.S. patent application Ser. No. 16/914,913, the complete disclosure of which is hereby incorporated by reference.

Methods 200 may include calibrating a distance sensor at 210 and/or positioning a probing assembly at 220 and include determining a sensed distance at 230 and calculating a probe distance at 240. Methods 200 also include adjusting a relative orientation at 250 and may include conveying an optical signal at 260 and/or determining a location at 270. Methods 200 further include regulating adjustment of a relative orientation at 280.

Calibrating the distance sensor at 210 may include performing any suitable calibration that may be utilized to quantify a sensed distance measured by the distance sensor, to calibrate the sensed distance, to correlate an electrical output from the distance sensor to an actual, or to a physical, distance between the sensor surface and the substrate surface, and/or to establish a spatial relationship between and/or among the optical probe, the probe tip, the distance sensor, and/or the sensor surface. The calibrating at 210 may be performed in any suitable manner.

As an example, the calibrating at 210 may include optically viewing the probe tip, the distance sensor, and/or a calibration surface along a viewing direction. The viewing direction may be parallel, or at least substantially parallel, to the plane that extends within the sensor surface. In some such examples, the calibrating at 210 further may include correlating an optically determined distance between the probe tip and the calibration surface to the electrical output from the distance sensor. Additionally or alternatively, and in some such examples, the calibrating at 210 may include establishing the spatial relationship between and/or among the optical probe, the probe tip, the distance sensor, and/or the sensor surface.

In some examples, the calibration surface may be defined by the substrate that includes the DUT. In some examples, the calibration surface may be defined by a calibration chuck that is separate and/or distinct from the substrate that includes the DUT. Examples of calibration chucks that may be utilized to perform the calibrating at 210 are disclosed in U.S. patent application Ser. No. 16/884,921, the complete disclosure of which is hereby incorporated by reference.

The calibrating at 210 may be performed with any suitable timing and/or sequence during methods 200. As examples, the calibrating at 210 may be performed prior to the positioning at 220, prior to the determining at 230, prior to the calculating at 240, prior to the adjusting at 250, prior to the conveying at 260, prior to the determining at 270, and/or prior to the regulating at 280. As another example, the calibrating at 210 may be performed intermittently and/or periodically, during methods 200, such as to improve an accuracy of methods 200.

Positioning the probing assembly at 220 may include positioning the probing assembly and the substrate relative to one another, such as with, via, and/or utilizing the positioning assembly. The positioning at 220 may include establishing any suitable spatial relationship, or initial spatial relationship, between the probing assembly and the substrate. Examples of the positioning assembly are disclosed herein with reference to positioning assembly 60 of FIG. 1.

As examples, the positioning at 220 may include positioning such that the sensor surface is proximate the substrate, proximate the substrate surface, within a threshold sensing distance of the substrate surface, distal the trench relative to the probe tip, in capacitive communication with the substrate surface, in capacitive communication with a trench-free region of the substrate surface, and/or in capacitive communication with a uniform region of the substrate surface. Such a configuration may permit and/or facilitate improved accuracy of the determining at 230 and/or may permit and/or facilitate initiation of the determining at 230. As additional examples, the positioning at 220 may include positioning such that the probe tip is proximate the trench, such that the probe tip is positioned above the trench, such that the probe tip is positioned within the trench, and/or such that a gap between the probe tip and the trench side-wall has a predetermined, predefined, desired, and/or specified value and/or magnitude.

In some examples, the predetermined magnitude for the gap may be specified based upon one or more properties of the probe systems. In general, the gap may be calculated as:

$$g = WD \cos(\theta)$$

where g is gap 36, WD is the working distance of the optical probe, or the distance that photons 38 travel from optical probe 30 to optical device 140, and θ is angle 34. In a specific example, the predetermined magnitude of the gap may be selected such that the optical device is in and/or within a focal plane of the optical probe. In this example, the WD term in the above equation may be replaced with, or may be equal to, a focal length of the optical probe.

The positioning at 220 may be performed with any suitable timing and/or sequence during methods 200. As examples, the positioning at 220 may be performed prior to the determining at 230, prior to the calculating at 240, prior to the adjusting at 250, prior to the conveying at 260, prior to the determining at 270, and/or prior to the regulating at 280. As another example, the positioning at 220 may be performed intermittently and/or periodically, during methods 200, such as to improve an accuracy of methods 200 and/or to permit and/or facilitate optically probing a different trench of the DUT.

Determining the sensed distance at 230 may include determining the sensed distance between the sensor surface and the substrate surface. This may include determining with, via, and/or utilizing the distance sensor, examples of which are disclosed herein. As discussed in more detail herein with reference to the positioning at 220, the distance sensor may be positioned, relative to the substrate surface, such that a region of the substrate that extends below the sensor surface is trench-free, is structure-free, and/or is uniform. Such a configuration may permit, facilitate, and/or increase an accuracy of the determining at 230.

Calculating the probe distance at 240 may include calculating at least one probe distance between the optical probe and the substrate. The calculating at 240 may be based, at least in part, on the sensed distance, as determined during the determining at 230, and/or the spatial relationship, as determined during the calibrating at 210.

In one example, the at least one probe distance may include and/or be a tip-bottom separation distance between the probe tip and a bottom surface of the trench. An example of the tip-bottom separation distance is illustrated in FIG. 2 at 72 and discussed in more detail herein. In this example, the threshold separation distance may include and/or be a threshold tip-bottom separation distance between the probe tip and the bottom surface of the trench. Stated another way, and in this example, the regulating at 280 may be utilized to maintain at least the threshold tip-bottom separation distance between the probe tip and the bottom surface of the trench and/or to decrease a potential for physical contact between the probe tip and the bottom surface of the trench.

In some examples, and with continued reference to FIG. 2, the threshold tip-bottom separation distance may be selected such that:

$$h = \frac{s}{2} < D$$

where h is a depth 39 of probe 30, within trench 130 and at a mid-point of a vertical scan of the probe tip along trench side-wall 132, s is a vertical distance 62 of the vertical scan, and D is a trench depth 134 of trench 130. Stated another way, and in this example, the regulating at 280 may include selecting and/or restricting depth 39 and/or vertical distance 62 to maintain at least the threshold tip-bottom separation distance between the probe tip and the bottom surface of the trench and/or to decrease the potential for physical contact between the probe tip and the bottom surface of the trench. In some examples, knowledge, or prior knowledge, of the predetermined spatial relationship, as determined during the calibrating at 210, and/or trench depth 134 may be utilized to permit and/or to facilitate the calculating at 240.

In another example, the at least one probe distance may include and/or be a probe-edge separation distance between the optical probe and a trench edge of the trench. An example of the probe-edge separation distance is illustrated in FIG. 2 at 74. In this example, the threshold separation distance may include and/or be a threshold probe-edge separation distance between the probe and the edge of the trench. Stated another way, and in this example, the regulating at 280 may be utilized to maintain at least the threshold probe-edge separation distance between the probe and the trench edge and/or to decrease a potential for physical contact between the probe and the trench edge.

In some examples, and with continued reference to FIG. 2, the threshold probe-edge separation distance may be selected such that:

$$c = \left(W - g - \frac{d}{2}\right)\tan\theta - h - \frac{s}{2} + \frac{d}{2} > 0$$

where c is threshold probe-edge separation distance as measured at 74, W is a trench width 136, g is gap 36, d is a diameter 31 of optical probe 30, θ is angle 34, h is depth 39, and s is vertical distance 62 of the vertical scan. Stated another way, and in this example, the regulating at 280 may include selecting and/or restricting depth 39 and/or vertical distance 62 to maintain at least the threshold probe-edge separation distance between the optical probe and the trench edge and/or to decrease the potential for physical contact between the optical probe and the trench edge. In some examples, knowledge, or prior knowledge, of the predetermined spatial relationship, as determined during the calibrating at 210, of trench width 136, of gap 36, and/or of diameter 31 may be utilized to permit and/or to facilitate the calculating at 240.

In another example, the at least one probe distance may include and/or be a tip-surface separation distance of the probe tip below the substrate surface. An example of the tip-surface separation distance is illustrated in FIG. 2 at 76. In this example, the threshold separation distance may include and/or be a threshold tip-surface separation distance of the probe tip below the substrate surface. Stated another way, and in this example, the regulating at 280 may be utilized to maintain at least the threshold tip-surface separation distance of the probe tip below the substrate surface and/or to decrease a potential for unproductive scanning should the probe tip extend above the substrate surface and/or out of the trench.

In some examples, and with continued reference to FIG. 2, the threshold tip-surface separation distance may be selected such that:

$$h = \delta + \frac{d}{2} - \left(g + \frac{d}{2}\right)\tan\theta$$

where h is depth 39, δ is a device distance 142 of optical device 140 below the substrate surface, d is diameter 31, g is gap 36, and θ is angle 34. Stated another way, and in this example, the regulating at 280 may include selecting depth 39 based upon device distance 142, diameter 31, gap 36, and/or angle 34. In some examples, knowledge, or prior knowledge, of the predetermined spatial relationship, as determined during the calibrating at 210, of device distance 142, diameter 31, gap 36, and/or angle 34 may be utilized to permit and/or to facilitate the calculating at 240.

Adjusting the relative orientation at 250 may include adjusting a relative orientation between the probing assembly and the DUT with the positioning assembly. In some examples, the adjusting at 250 may include vertically scanning the probe tip within the trench and up-and-down along at least a threshold vertical region of the trench side-wall, as indicated at 252. In some examples, the adjusting at 250 may include horizontally scanning the probe tip within the trench and across at least a threshold horizontal region of the trench side-wall, as indicated at 254. When the adjusting at 250 includes both the vertically scanning at 252 and the horizontally scanning at 254, the adjusting at 250 additionally or alternatively may be referred to herein as raster scanning the probe tip along the trench side-wall. In some examples, the adjusting at 250 additionally or alternatively may include rotating the probe tip, relative to the optical device, about one axis, about two orthogonal axes, or about three orthogonal axes, as indicated at 256.

Conveying the optical signal at 260 may include conveying any suitable optical signal between the optical device and the probe tip. This may include conveying the optical signal from the optical device to the probe tip and/or conveying the optical signal from the probe tip to the optical device. The conveying at 260 may be performed with any suitable timing and/or sequence during methods 200. As examples, the conveying at 260 may be performed during the adjusting at 250, including during the vertically scanning at 252 and/or during the horizontally scanning at 254, when performed.

Determining the location at 270 may include determining any suitable location, or relative orientation, at which optical coupling between the probe tip and the optical device is maximized, exhibits a localized maxima, and/or is greater than at other measured locations, relative orientations, and/or relative rotational orientation. As an example, and when methods 200 include performing the conveying at 260 during the vertically scanning at 252, the determining at 270 may include determining a vertical location at which optical coupling between the probe tip and the optical device is maximized.

As another example, and when methods 200 include performing the conveying at 260 during the horizontally scanning at 254, the determining at 270 may include determining a horizontal location at which optical coupling between the probe tip and the optical device is maximized. As yet another example, and when methods 200 include performing the conveying at 260 during both the horizontally scanning at 254 and the vertically scanning at 252, the determining at 270 may include generating a two-dimensional representation of optical coupling between the probe tip and the optical device as a function of location on the trench side-wall.

Such a two-dimensional representation may be utilized to determine an improved, or even an optimal, relative orientation between the optical probe and the optical device during testing of the optical device by the probe systems. Additionally or alternatively, and when methods 200 include performing the conveying at 260 during the horizontally scanning 254, the vertically scanning at 252, and the rotating at 256, the determining at 270 may include generating a multi-dimensional representation of optical coupling between the probe tip and the optical device as a function of location on the trench side-wall and rotation of the optical probe relative to the trench side wall.

Regulating adjustment of the relative orientation at 280 may include regulating and/or controlling the adjusting at 250 based, at least in part, on the at least one probe distance, such as to maintain at least the threshold separation distance between the optical probe and the substrate. Examples of the at least one probe distance and the at least one separation distance are disclosed herein.

The regulating at 280 may be accomplished in any suitable manner. As an example, the regulating at 280 may include limiting motion of the optical probe and/or of the substrate to maintain the threshold separation distance. As another example, the regulating at 280 may include notifying an operator of the probe system if the operator directs the adjusting at 250 in a manner that would cause the probe system to be unable to maintain the threshold separation distance. More specific examples of the regulating at 280 are discussed herein with reference to the more specific examples of the calculating at 240.

In some examples, methods 200 may be performed automatically and/or repeatedly. In these examples, the probe systems may include a controller, such as controller 70 of FIG. 1, that may be programmed to perform the methods. In such a configuration, methods 200 may include automatically and repeatedly performing at least the determining at 230, the calculating at 240, the adjusting at 250, and/or the regulating at 280 with, via, and/or utilizing the controller. The automatically and repeatedly performing may be performed within a given trench of the DUT and/or to quantify optical coupling between a given optical device and the optical probe. Additionally or alternatively, the automatically and repeatedly performing may include quantifying optical coupling between the optical probe and another optical device, which may be present within the same and/or within a different trench of the DUT.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entities in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" may mean A alone, B alone, C alone, A and B together, A and C together, B and C together, A, B, and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

As used herein, "at least substantially," when modifying a degree or relationship, may include not only the recited "substantial" degree or relationship, but also the full extent of the recited degree or relationship. A substantial amount of a recited degree or relationship may include at least 75% of the recited degree or relationship. For example, an object that is at least substantially formed from a material includes objects for which at least 75% of the objects are formed from the material and also includes objects that are completely formed from the material. As another example, a first length that is at least substantially as long as a second length includes first lengths that are within 75% of the second length and also includes first lengths that are as long as the second length.

Illustrative, non-exclusive examples of systems and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A method of optically probing a trench side-wall of a trench defined within a device under test (DUT), which is defined on a substrate that defines a substrate surface, with a probe system, wherein the trench side-wall includes an optical device positioned a device distance below the substrate surface, wherein the probe system includes a probing assembly that includes an optical probe and a distance sensor, or a capacitive distance sensor, that defines a sensor surface, wherein the optical probe extends through a plane that extends within the sensor surface, wherein a probe tip of the optical probe is positioned on a sensor-opposed side of the plane, and further wherein the probe system includes a positioning assembly configured to selectively regulate a relative orientation between the probing assembly and the DUT, the method comprising:

determining a sensed distance between the sensor surface and the substrate surface;

calculating at least one probe distance between the optical probe and the substrate, wherein the calculating is based, at least in part, on the sensed distance;

adjusting the relative orientation between the probing assembly and the DUT with the positioning assembly; and regulating the adjusting based, at least in part, on the at least one probe distance to maintain at least a threshold separation distance between the optical probe and the substrate.

A2. The method of paragraph A1, wherein, prior to the determining the sensed distance, the method further includes positioning the probing assembly and the substrate relative to one another, with the positioning assembly, such that at least one of:

(i) the sensor surface is proximate the substrate surface;
(ii) the sensor surface is within a threshold sensing distance of the substrate surface;
(iii) the sensor surface is distal the trench relative to the probe tip;
(iv) the sensor surface is in capacitive communication with the substrate surface;
(v) the sensor surface is in capacitive communication with a trench-free region of the substrate surface;
(vi) the sensor surface is in capacitive communication with a structure-free region of the substrate surface; and
(vii) the sensor surface is in capacitive communication with a uniform region of the substrate surface.

A3. The method of any of paragraphs A1-A2, wherein, prior to the determining the sensed distance, the method further includes positioning the probing assembly and the substrate relative to one another, with the positioning assembly, such that at least one of:

(i) the probe tip is proximate the trench;
(ii) the probe tip is positioned above the trench; and
(iii) the probe tip is positioned within the trench.

A4. The method of any of paragraphs A1-A3, wherein the at least one probe distance includes a tip-bottom separation distance between the probe tip and a bottom surface of the trench.

A5. The method of paragraph A4, wherein the threshold separation distance includes a threshold tip-bottom separation distance between the probe tip and the bottom surface of the trench.

A6. The method of any of paragraphs A1-A5, wherein the at least one probe distance includes a probe-edge separation distance between the optical probe and a trench edge of the trench.

A7. The method of paragraph A6, wherein the threshold separation distance includes a threshold probe-edge separation distance between the optical probe and the trench edge.

A8. The method of any of paragraphs A1-A7, wherein the at least one probe distance includes a tip-surface separation distance of the probe tip below the substrate surface.

A9. The method of paragraph A8, wherein the threshold separation distance includes a threshold tip-surface separation distance of the probe tip below the substrate surface.

A10. The method of any of paragraphs A1-A9, wherein the adjusting the relative orientation between the probing assembly and the DUT includes vertically scanning the probe tip within the trench and up-and-down at least a threshold vertical region of the trench side-wall.

A11. The method of paragraph A10, wherein, during the vertically scanning, the method further includes conveying an optical signal between the optical device and the probe tip.

A12. The method of paragraph A11, wherein, during the vertically scanning, the method further includes determining a vertical location at which optical coupling between the probe tip and the optical device is maximized.

A13. The method of any of paragraphs A10-A12, wherein the adjusting the relative orientation between the probing assembly and the DUT includes horizontally scanning the probe tip within the trench and across at least a threshold horizontal region of the trench side-wall.

A14. The method of paragraph A13, wherein, during the horizontally scanning, the method further includes conveying the optical signal between the optical device and the probe tip.

A15. The method of paragraph A14, wherein, during the horizontally scanning, the method further includes determining a horizontal location at which optical coupling between the probe tip and the optical device is maximized.

A16. The method of any of paragraphs A14-A15, wherein the horizontally scanning and the vertically scanning include generating a two-dimensional representation of optical coupling between the probe tip and the optical device as a function of location on the trench side-wall.

A17. The method of any of paragraphs A10-A16, wherein the adjusting the relative orientation between the probing assembly and the DUT includes rotating the probe tip relative to the optical device.

A18. The method of paragraph A17, wherein, during the rotating, the method further includes conveying the optical signal between the optical device and the probe tip.

A19. The method of paragraph A18, wherein, during the rotating, the method further includes determining a relative rotational orientation at which optical coupling between the probe tip and the optical device is maximized.

A20. The method of any of paragraphs A18-A19, wherein the horizontally scanning, the vertically scanning, and the rotating include generating a multi-dimensional representation of optical coupling between the probe tip and the optical device as a function of location on the trench side-wall and also as a function of rotation of the optical probe relative to the trench side-wall.

A21. The method of any of paragraphs A1-A20, wherein, prior to the determining the sensed distance, the method further includes calibrating the distance sensor.

A22. The method of paragraph A21, wherein the calibrating includes optically viewing the probe tip, the distance sensor, and a calibration surface along a viewing direction that is parallel, or at least substantially parallel, to the plane that extends within the sensor surface and correlating an optically determined distance between the probe tip and the calibration surface to an electrical output of the distance sensor.

A23. The method of any of paragraphs A1-A22, wherein the method includes automatically and repeatedly performing the determining the sensed distance, the calculating the at least one probe distance, the adjusting the relative orientation, and the regulating the adjusting utilizing a controller of the probe system.

B1. A probe system for optically probing a trench side-wall of a trench defined within a device under test (DUT), which is defined on a substrate that defines a substrate surface, wherein the trench side-wall includes an optical device positioned a device distance below the substrate surface, the probe system comprising:
  a probing assembly that includes an optical probe that defines a probe tip and a distance sensor that defines a sensor surface, wherein the optical probe extends through a plane that extends within the sensor surface, and further wherein the probe tip is positioned on a sensor-opposed side of the plane;
  a support surface configured to support the substrate;
  a positioning assembly configured to selectively regulate a relative orientation between the probing assembly and the DUT; and
  a controller programmed to control the operation of the probe system according to the method of any of paragraphs A1-A23.

B2. The probe system of paragraph B1, wherein the probe system includes the substrate.

C1. A probe system for optically probing a trench side-wall of a trench defined within a device under test (DUT), which is defined on a substrate that defines a substrate surface, wherein the trench side-wall includes an optical device positioned a device distance below the substrate surface, the probe system comprising:
  a probing assembly that includes an optical probe that defines a probe tip and a distance sensor that defines a sensor surface, wherein the optical probe extends through a plane that extends within the sensor surface, and further wherein the probe tip is positioned on a sensor-opposed side of the plane;
  a support surface configured to support the substrate;
  a positioning assembly configured to selectively regulate a relative orientation between the probing assembly and the DUT; and
  a controller programmed to control the operation of the probe system by:
    (i) determining a sensed distance between the sensor surface and the substrate surface;
    (ii) calculating at least one probe distance between the optical probe and the substrate based, at least in part, on the sensed distance;
    (iii) adjusting the relative orientation between the probing assembly and the DUT with the positioning assembly; and
    (iv) regulating the adjustment of the relative orientation based, at least in part, on the at least one probe distance to maintain at least a threshold separation distance between the optical probe and the substrate.

C2. The probe system of paragraph C1, wherein, prior to determining the sensed distance, the controller further is programmed to position the probing assembly and the substrate relative to one another, with the positioning assembly, such that at least one of:
  (i) the sensor surface is proximate the substrate surface;
  (ii) the sensor surface is within a threshold sensing distance of the substrate surface;
  (iii) the sensor surface is distal the trench relative to the probe tip;
  (iv) the sensor surface is in capacitive communication with the substrate surface;
  (v) the sensor surface is in capacitive communication with a trench-free region of the substrate surface;
  (vi) the sensor surface is in capacitive communication with a structure-free region of the substrate surface; and
  (vii) the sensor surface is in capacitive communication with a uniform region of the substrate surface.

C3. The probe system of any of paragraphs C1-C2, wherein, prior to determining the sensed distance, the controller further is programmed to position the probing assembly and the substrate relative to one another, with the positioning assembly, such that at least one of:
  (i) the probe tip is proximate the trench;
  (ii) the probe tip is positioned above the trench; and
  (iii) the probe tip is positioned within the trench.

C4. The probe system of any of paragraphs C1-C3, wherein the at least one probe distance includes a tip-bottom separation distance between the probe tip and a bottom surface of the trench, optionally wherein the threshold separation distance includes a threshold tip-bottom separation distance between the probe tip and the bottom surface of the trench.

C5. The probe system of any of paragraphs C1-C4, wherein the at least one probe distance includes a probe-edge separation distance between the optical probe and a trench edge of the trench, optionally wherein the threshold separation distance includes a threshold probe-edge separation distance between the optical probe and the trench edge.

C6. The probe system of any of paragraphs C1-C5, wherein the at least one probe distance includes a tip-surface separation distance of the probe tip below the substrate surface, optionally wherein the threshold separation distance includes a threshold tip-surface separation distance of the probe tip below the substrate surface.

C7. The probe system of any of paragraphs C1-C6, wherein adjusting the relative orientation between the probing assembly and the DUT includes vertically scanning the probe tip within the trench and up-and-down at least a threshold vertical region of the trench side-wall, optionally wherein, during the vertically scanning, the controller further is programmed to at least one of:
  (i) convey an optical signal between the optical device and the probe tip; and
  (ii) determine a vertical location at which optical coupling between the probe tip and the optical device is maximized.

C8. The probe system of paragraph C7, wherein adjusting the relative orientation between the probing assembly and the DUT further includes horizontally scanning the probe tip within the trench and across at least a threshold horizontal region of the trench side-wall, optionally wherein, during the horizontally scanning, the controller further is programmed to at least one of:
  (i) convey the optical signal between the optical device and the probe tip; and
  (ii) determine a horizontal location at which optical coupling between the probe tip and the optical device is maximized.

C9. The probe system of paragraph C8, wherein the controller further is programmed to perform the horizontally scanning and the vertically scanning to generate a two-dimensional representation of optical coupling between the probe tip and the optical device as a function of location on the trench side-wall.

C10. The probe system of any of paragraphs C8-C9, wherein the adjusting the relative orientation between the probing assembly and the DUT further includes rotating the probe tip relative to the optical device, optionally wherein, during the rotating, the controller further is programmed to at least one of:
  (i) convey the optical signal between the optical device and the probe tip; and
  (ii) determine a relative rotational orientation at which optical coupling between the probe tip and the optical device is maximized.

C11. The probe system of paragraph C10, wherein the controller further is programmed to perform the horizontally scanning, the vertically scanning, and the rotating to generate a multi-dimensional representation of optical coupling between the probe tip and the optical device as a function of location on the trench side-wall and also as a function of rotation of the optical probe relative to the trench side-wall.

C12. The probe system of any of paragraphs C1-C11, wherein the probe system includes an optical assembly configured to optically view the probe tip, the distance sensor, and a calibration surface along a viewing direction that is parallel, or at least substantially parallel, to the plane that extends within the sensor surface, and optionally wherein the controller further is programmed to calibrate an optically determined distance between the probe tip and the calibration surface to an electrical output of the distance sensor.

C13. The probe system of any of paragraphs C1-C12, wherein the controller further is programmed to automatically and repeatedly determine the sensed distance, calculate the at least one probe distance, adjust the relative orientation, and regulate the adjustment.

D1. Non-transitory computer-readable storage media including computer-readable instructions that, when executed, direct a probe system to perform the method of any of paragraphs A1-A23.

INDUSTRIAL APPLICABILITY

The systems and methods disclosed herein are applicable to the optical device fabrication and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A probe system for optically probing a trench side-wall of a trench defined within a device under test (DUT), which is defined on a substrate that defines a substrate surface, wherein the trench side-wall includes an optical device positioned a device distance below the substrate surface, the probe system comprising:
  a probing assembly that includes an optical probe that defines a probe tip and a distance sensor that defines a sensor surface, wherein the optical probe extends through a plane that extends within the sensor surface, and further wherein the probe tip is positioned on a sensor-opposed side of the plane;
  a support surface configured to support the substrate;
  a positioning assembly configured to selectively regulate a relative orientation between the probing assembly and the DUT; and
  a controller programmed to control the operation of the probe system by:
    (i) determining a sensed distance between the sensor surface and the substrate surface;
    (ii) calculating at least one probe distance between the optical probe and the substrate based, at least in part, on the sensed distance;
    (iii) adjusting the relative orientation between the probing assembly and the DUT with the positioning assembly; and
    (iv) regulating the adjustment of the relative orientation based, at least in part, on the at least one probe distance to maintain at least a threshold separation distance between the optical probe and the substrate.

2. The probe system of claim 1, wherein, prior to determining the sensed distance, the controller further is programmed to position the probing assembly and the substrate relative to one another, with the positioning assembly, such that at least one of:
  (i) the probe tip is proximate the trench;
  (ii) the probe tip is positioned above the trench; and
  (iii) the probe tip is positioned within the trench.

3. The probe system of claim 1, wherein the at least one probe distance includes a tip-bottom separation distance between the probe tip and a bottom surface of the trench, and further wherein the threshold separation distance includes a threshold tip-bottom separation distance between the probe tip and the bottom surface of the trench.

4. The probe system of claim 1, wherein the at least one probe distance includes a probe-edge separation distance between the optical probe and a trench edge of the trench, and further wherein the threshold separation distance includes a threshold probe-edge separation distance between the optical probe and the trench edge.

5. The probe system of claim 1, wherein the at least one probe distance includes a tip-surface separation distance of the probe tip below the substrate surface, and further wherein the threshold separation distance includes a threshold tip-surface separation distance of the probe tip below the substrate surface.

6. The probe system of claim 1, wherein adjusting the relative orientation between the probing assembly and the DUT includes vertically scanning the probe tip within the trench and up-and-down at least a threshold vertical region of the trench side-wall, wherein, during the vertically scanning, the controller further is programmed to:
  (i) convey an optical signal between the optical device and the probe tip; and
  (ii) determine a vertical location at which optical coupling between the probe tip and the optical device is maximized.

7. The probe system of claim 6, wherein adjusting the relative orientation between the probing assembly and the DUT further includes horizontally scanning the probe tip within the trench and across at least a threshold horizontal region of the trench side-wall, wherein, during the horizontally scanning, the controller further is programmed to:
  (i) convey the optical signal between the optical device and the probe tip; and
  (ii) determine a horizontal location at which optical coupling between the probe tip and the optical device is maximized.

8. The probe system of claim 7, wherein the controller further is programmed to perform the horizontally scanning and the vertically scanning to generate a two-dimensional representation of optical coupling between the probe tip and the optical device as a function of location on the trench side-wall.

9. The probe system of claim 7, wherein the adjusting the relative orientation between the probing assembly and the DUT further includes rotating the probe tip relative to the optical device, wherein, during the rotating, the controller further is programmed to:
  (i) convey the optical signal between the optical device and the probe tip; and
  (ii) determine a relative rotational orientation at which optical coupling between the probe tip and the optical device is maximized.

10. The probe system of claim 9, wherein the controller further is programmed to perform the horizontally scanning, the vertically scanning, and the rotating to generate a multi-dimensional representation of optical coupling between the probe tip and the optical device as a function of location on the trench side-wall and also as a function of rotation of the optical probe relative to the trench side-wall.

11. The probe system of claim 1, wherein the controller further is programmed to automatically and repeatedly determine the sensed distance, calculate the at least one probe distance, adjust the relative orientation, and regulate the adjustment.

12. A method of optically probing a trench side-wall of a trench defined within a device under test (DUT), which is defined on a substrate that defines a substrate surface, with a probe system, wherein the trench side-wall includes an optical device positioned a device distance below the substrate surface, wherein the probe system includes a probing assembly that includes an optical probe and a distance sensor that defines a sensor surface, wherein the optical probe extends through a plane that extends within the sensor surface, wherein a probe tip of the optical probe is positioned on a sensor-opposed side of the plane, and further wherein the probe system includes a positioning assembly configured to selectively regulate a relative orientation between the probing assembly and the DUT, the method comprising:
  determining a sensed distance between the sensor surface and the substrate surface;
  calculating at least one probe distance between the optical probe and the substrate, wherein the calculating is based, at least in part, on the sensed distance;
  adjusting the relative orientation between the probing assembly and the DUT with the positioning assembly; and
  regulating the adjusting based, at least in part, on the at least one probe distance to maintain at least a threshold separation distance between the optical probe and the substrate.

13. The method of claim 12, wherein, prior to the determining the sensed distance, the method further includes positioning the probing assembly and the substrate relative to one another, with the positioning assembly, such that at least one of:
  (i) the probe tip is proximate the trench;
  (ii) the probe tip is positioned above the trench; and
  (iii) the probe tip is positioned within the trench.

14. The method of claim 12, wherein the at least one probe distance includes a tip-bottom separation distance between the probe tip and a bottom surface of the trench, and further wherein the threshold separation distance includes a threshold tip-bottom separation distance between the probe tip and the bottom surface of the trench.

15. The method of claim 12, wherein the at least one probe distance includes a probe-edge separation distance between the optical probe and a trench edge of the trench, and further wherein the threshold separation distance includes a threshold probe-edge separation distance between the optical probe and the trench edge.

16. The method of claim 12, wherein the at least one probe distance includes a tip-surface separation distance of the probe tip below the substrate surface, and further wherein the threshold separation distance includes a threshold tip-surface separation distance of the probe tip below the substrate surface.

17. The method of claim 12, wherein the adjusting the relative orientation between the probing assembly and the DUT includes vertically scanning the probe tip within the trench and up-and-down at least a threshold vertical region of the trench side-wall, and further wherein, during the vertically scanning, the method further includes:
  (i) conveying an optical signal between the optical device and the probe tip; and
  (ii) determining a vertical location at which optical coupling between the probe tip and the optical device is maximized.

18. The method of claim 17, wherein the adjusting the relative orientation between the probing assembly and the DUT includes horizontally scanning the probe tip within the trench and across at least a threshold horizontal region of the trench side-wall, and further wherein, during the horizontally scanning, the method further includes:
  (i) conveying the optical signal between the optical device and the probe tip; and
  (ii) determining a horizontal location at which optical coupling between the probe tip and the optical device is maximized.

19. The method of claim 18, wherein the horizontally scanning and the vertically scanning include generating a two-dimensional representation of optical coupling between the probe tip and the optical device as a function of location on the trench side-wall.

20. Non-transitory computer-readable storage media including computer-readable instructions that, when executed, direct a probe system to perform the method of claim 12.

* * * * *